(12) United States Patent
Ju

(10) Patent No.: US 6,424,009 B1
(45) Date of Patent: Jul. 23, 2002

(54) POLYSILICON INSULATOR MATERIAL IN SEMICONDUCTOR-ON-INSULATOR (SOI) STRUCTURE

(75) Inventor: Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/849,560

(22) Filed: May 4, 2001

(51) Int. Cl.[7] ................................................ H01L 27/01
(52) U.S. Cl. ...................................... 257/347; 257/349
(58) Field of Search ................. 257/347, 349; 438/455; 437/229, 126, 228

(56) References Cited

U.S. PATENT DOCUMENTS 5,376,579 A * 12/1994 Annamalai .................. 437/126
5,378,659 A * 1/1995 Roman et al. ............... 437/229
6,091,112 A * 7/2000 Kwon ......................... 257/347

FOREIGN PATENT DOCUMENTS

JP           361202418 A  *  9/1986  ........... H01L/21/20

* cited by examiner

Primary Examiner—Hoai V. Ho
Assistant Examiner—Thinh Nguyen
(74) Attorney, Agent, or Firm—Renner, Otto, Boisselle & Sklar, LLP

(57) ABSTRACT

A device and method for making a semiconductor-on-insulator (SOI) structure having a polysilicon layer disposed between a semiconductor substrate and a semiconductor layer.

20 Claims, 6 Drawing Sheets

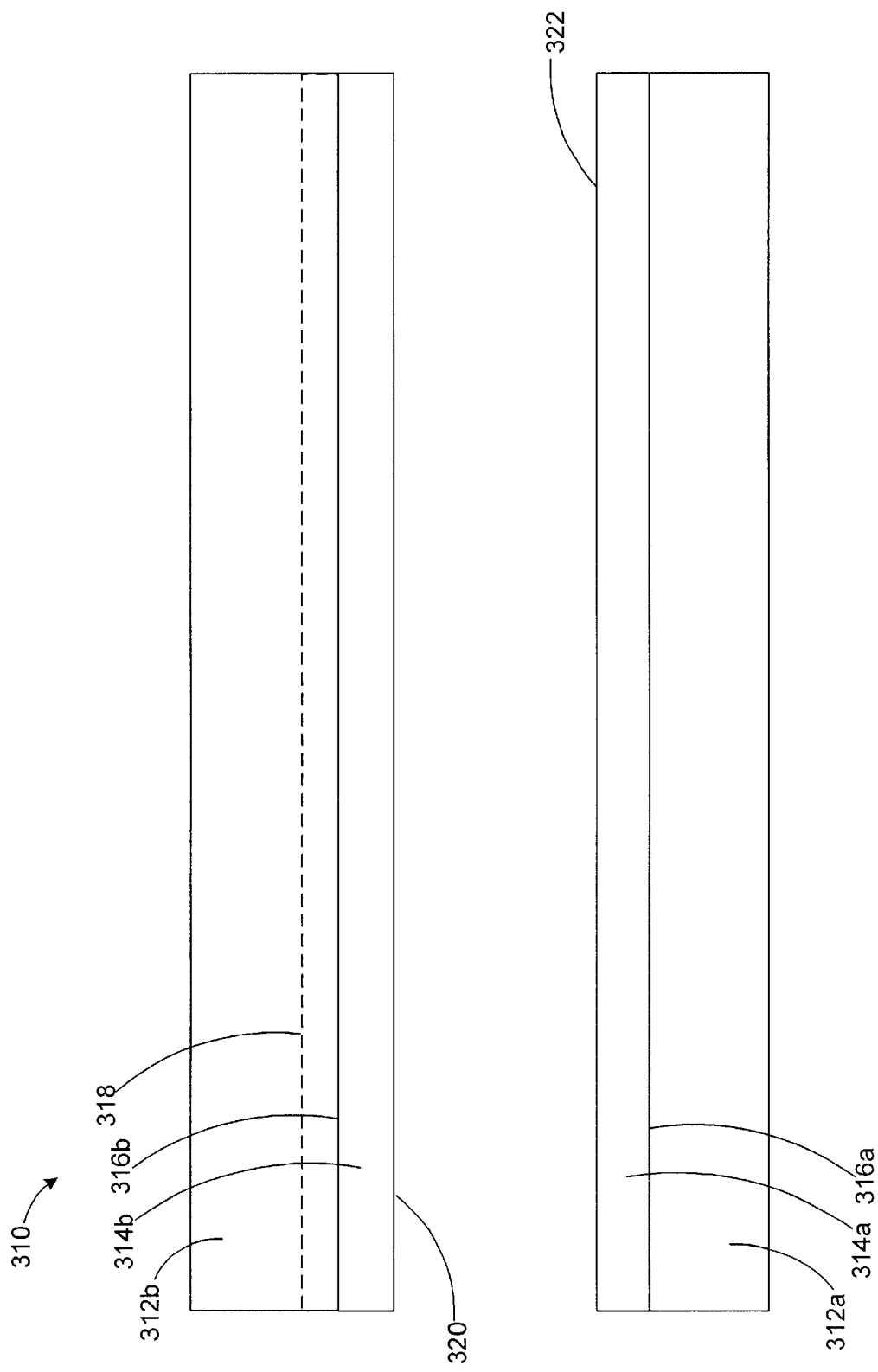

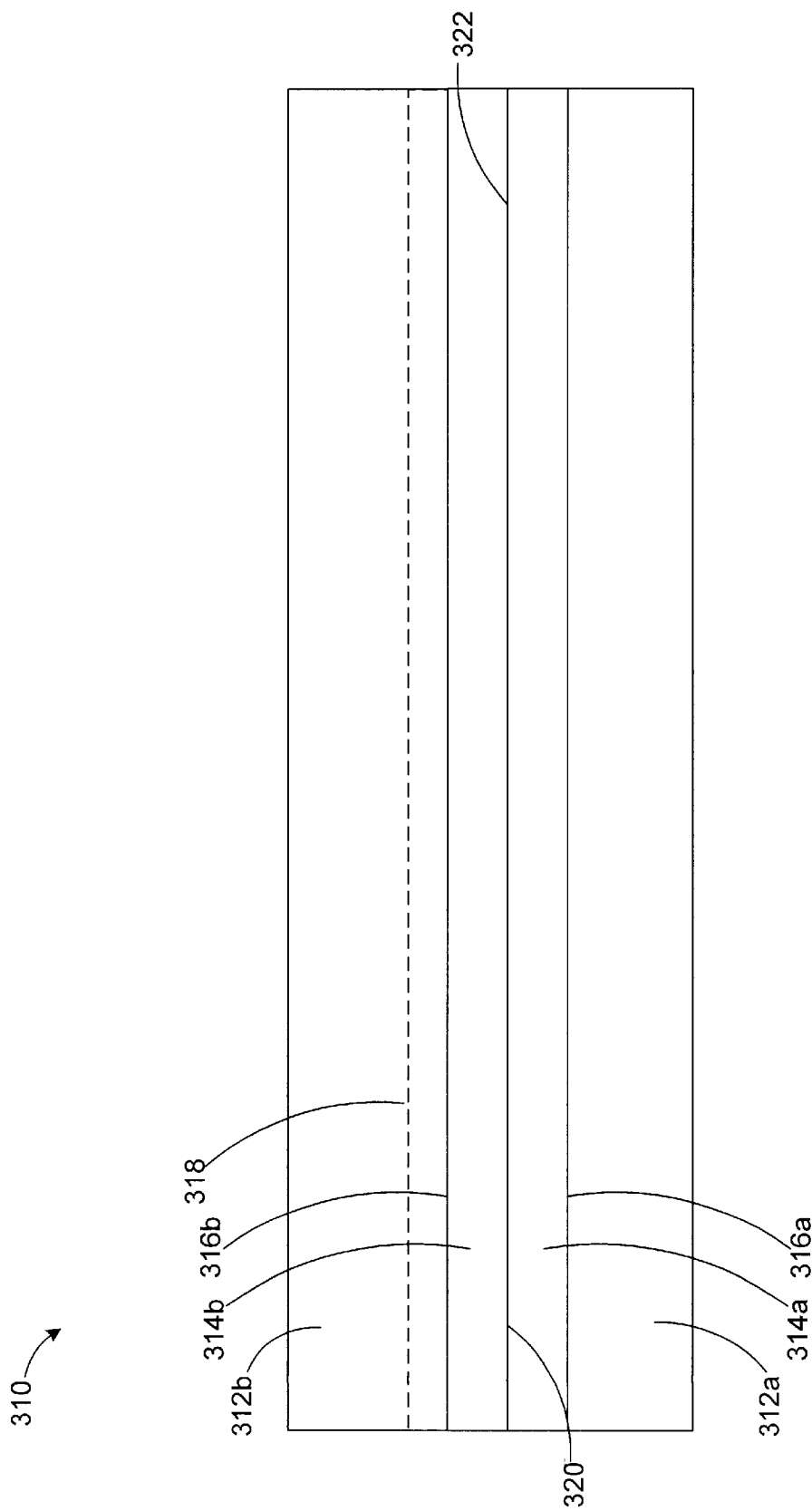

POLYSILICON INSULATOR MATERIAL IN SEMICONDUCTOR-ON-INSULATOR (SOI) STRUCTURE

TECHNICAL FIELD

The present invention generally relates to the manufacture of semiconductor structures and, more specifically, relates to the manufacture of semiconductor-on-insulator (SOI) structures.

BACKGROUND ART

Semiconductor-on-insulator (SOI) structures have several advantages over conventional bulk substrates: the elimination of latch-up, reduced short-channel effects, improved radiation hardness, dynamic coupling, lower parasitic junction capacitance, and simplified device isolation and fabrication. Such advantages allow semiconductor device manufactures to produce low-voltage low-power high-speed devices thereon. For example, metal-oxide semiconductor field effect transistors (MOSFETs) are commonly formed on SOI structures. However, MOSFETs formed on such SOI structures suffer from a floating body effect (FBE) and self-heating.

Unlike bulk silicon MOSFETs, an SOI MOSFET is usually electrically floating in relation to the substrate. In a non-fully depleted MOSFET, carriers (holes in nMOSFETs and electrons in pMOSFETs) generated by impact ionization accumulate near the source/body junctions of the MOSFET. Eventually, sufficient carriers will accumulate to forward bias the body with respect to the source thus lowering the threshold voltage through the body-bias effect. Extra current will start flowing resulting in a "kink" in the I–V characteristics. The extra current flow reduces the achievable gain and dynamic swing in analog circuits, and gives rise to an abnormality in the transfer characteristics in digital circuits. Additionally, the FBE causes higher device leakages and undesirable transient effects.

One attempted solution to solve problems due to the FBE is to provide a contact to the body for hole current collection. However, currently available hole collection schemes, including the use of a side-contact or a mosaic source are very inefficient and consume significant amounts of wafer area.

Another problem associated with SOI structures is self-heating. Self-heating due to poor thermal conductivity of the buried oxide layer, in addition to causing circuit performance degradation, also increases device failure due to Joule heating. Further, severe localized silicon heating can result in junction melting and silicon melt filament formation. Such junction melting and filament formation may cause electrical shorts among the gate, source, drain and body of the MOSFET, thus resulting in device failure.

The thermal conductivity of the insulator materials determines in part how efficiently the heat is dissipated. The heat generated in the device regions propagates vertically to the semiconductor substrate via the BOX layer, $SiO_2$, and laterally to the oxide isolation trenches in the non-device regions. The thermal conductivity of $SiO_2$ is about 1.7 W/mK, whereas the thermal conductivity of the Si substrate is about 170 W/mK. A material with a lower thermal conductivity value means the material dissipates heat less effectively than the material with a higher value. Thus, the lower thermal conductivity of $SiO_2$, the BOX layer, does not propagate efficiently the heat generated by the SOI devices to the substrate through the BOX layer. Therefore, the $SiO_2$ BOX layer inhibits cooling of the SOI devices and causes severe self-heating effects, which prevents the maximum available power consumption from increasing.

Additionally, this increases the maximum interconnect temperature, and makes conduction cooling through the source, drain, and interconnects important. In addition, the device mobility is reduced as a result of the higher channel temperature, reducing the maximum drain saturation current and causing a negative differential conductance in the saturation region. Thermal protection schemes designed for SOI circuits have been proposed using contact plugs in diodes. Although effective in dissipating heat, contact plugs consume large wafer area, introduce large delays, and increase manufacturing.

Therefore, there exists a strong need in the art for an SOI structure with a buried insulator layer that bleeds off extra carriers into a channel of the substrate, has a resistance and thermally conducts heat away from the device at a rate greater than conventional $SiO_2$ insulator layers at room temperature.

SUMMARY OF THE INVENTION

According to one aspect of the invention, the invention is a semiconductor-on-insulator (SOI) structure having a polysilicon layer disposed between a semiconductor substrate and a semiconductor layer.

According to another aspect of the invention, the invention is a method of fabricating a semiconductor-on-insulator (SOI) structure having a polysilicon layer disposed between a semiconductor substrate and a semiconductor layer. The method includes the steps of depositing a polysilicon layer on a first semiconductor substrate and depositing a polysilicon layer on a second semiconductor substrate. Further, the method includes the step of creating a zone of weakness under a surface of one of the semiconductor substrates. Next, the method requires the placing of one of the semiconductor substrates on top of the other semiconductor substrate such that the polysilicon layer of the first semiconductor substrate is in contact with the polysilicon layer of the second semiconductor substrate. The method also includes the step of breaking the zone of weakness of the one semiconductor substrate and repairing a damaged surface resulting from the breaking of the zone of weakness of the one semiconductor substrate.

According to another aspect of the invention, the invention is a method of fabricating an SOI structure as described above. However, the method step of repairing the surface resulting from the breaking of the zone of weakness further includes the step of polishing the surface in order to remove residual weak zone damage.

According to another aspect of the invention, the invention is a method of fabricating an SOI structure as described in the first method above. The method further includes the additional step of fusing the polysilicon layer of the first semiconductor substrate with the polysilicon layer of the second semiconductor substrate.

BRIEF DESCRIPTION OF DRAWINGS

These and further features of the present invention will be apparent with reference to the following description and drawings, wherein:

FIGS. 3A–3C are cross-section views of the SOI structure according to the present invention at intermediate stages of manufacture.

DISCLOSURE OF INVENTION

Figure 1:
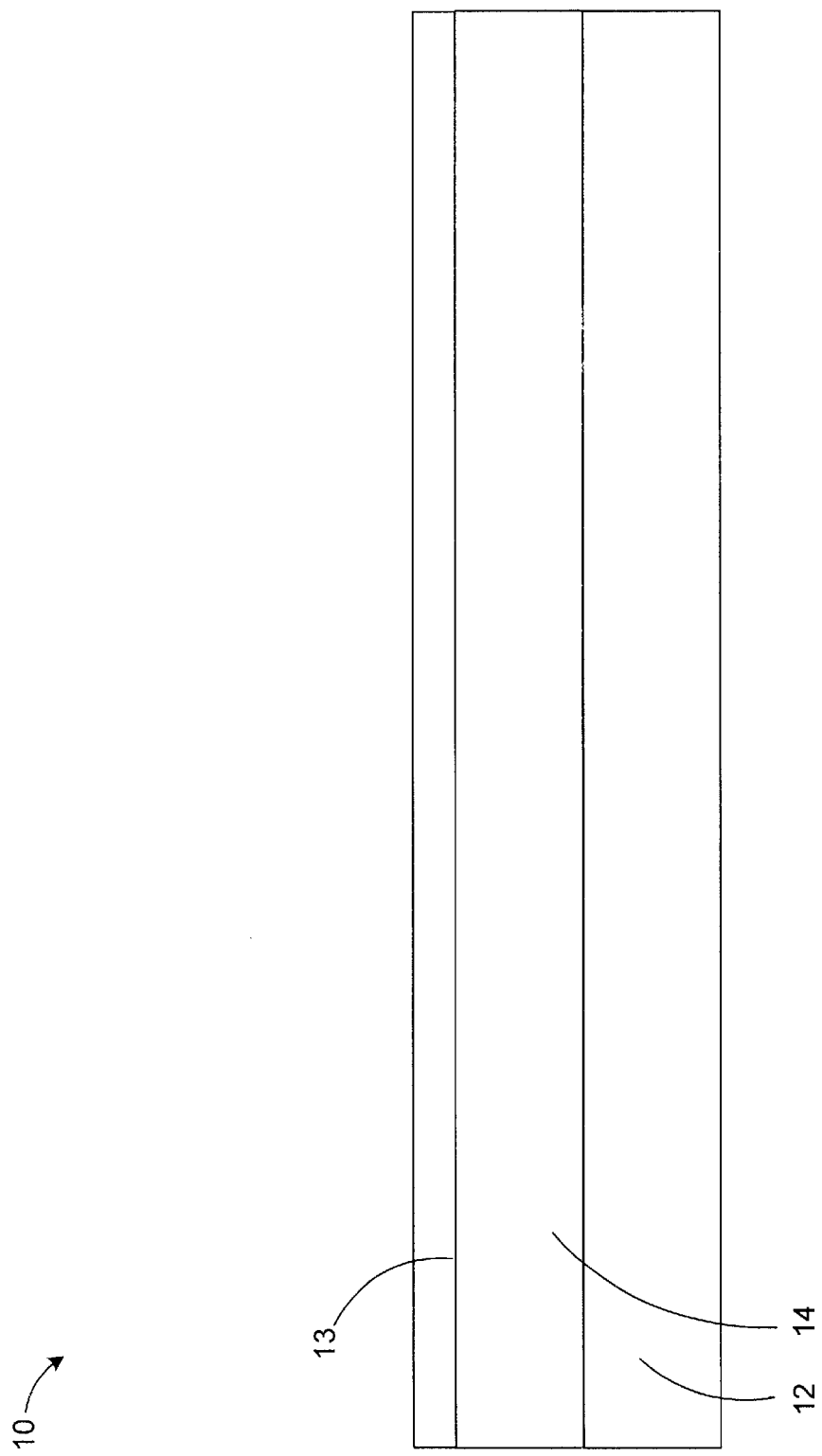
FIG. 1 is a cross-section of an SOI structure according to the present invention.

In the detailed description that follows, identical components have been given the same reference numerals. To illustrate the present invention in a clear and concise manner, the drawings may not necessarily be to scale and certain features may be shown in a partial schematic format.

The present invention is a semiconductor on insulator (SOI) structure, and method of making the same, comprising an insulator layer of electrically resistive silicon, e.g. doped polysilicon, undoped polysilicon, or the like, interposed between a semiconductor substrate and a semiconductor layer. Electronic devices such as metal-oxide semiconductor field effect transistors, i.e. MOSFETs, may be formed in device regions of the semiconductor layer defined laterally by isolation regions such as shallow trench isolation (STI) regions and vertically by the insulator layer.

MOSFETs formed on such SOI structures will be significantly less affected by the FBE and self-heating due to the resistive silicon layer being made of a material with properties that allow leakage at a level approximately equal to the currently used material of $SiO_2$ while more efficiently dissipating heat due to a significantly higher thermal conductivity. The resistive silicon layer of doped or undoped polysilicon or the like has an electrical resistivity or specific resistance greater than that of the semiconductor substrate and the semiconductor layer.

Specific resistance refers to the opposition presented by a material to the flow of electricity. Resistivity is an intrinsic property of a material independent of the amount or shape. Pure Si normally used in the substrate and semiconductor layer has a higher resistivity than metals, because the number of charge carriers is much reduced. Polysilicon would have a resistivity slightly higher than pure Si due to the arrangement of the lattice structure and the grain size. Thus, the resistive silicon layer can be tailored to allow a leakage current equal to the leakage current allowed through a traditional buried oxide layer of $SiO_2$ by controlling the arrangement of the lattice structure and/or the grain size. Further, the leakage current through the resistive silicon layer can be tailored so that the total chip power consumption does not significantly increase.

Additionally, a thick resistive silicon layer will have a thermal conductivity of between about 85 W/mK to about 145 W/mK. This is about 50 to about 85 times greater than the thermal conductivity of $SiO_2$. Since the resistive silicon layer has a substantially greater thermal conductivity than that of $SiO_2$, improved heat dissipation can be obtained. That is if the resistive silicon layer has a suitable electrical resistivity for the operating frequency range of the semiconductor device. Also, the resistive silicon layer can be regarded as a dielectric concerning the parasitic capacitance between the substrate and a conductor formed over the device region. It should be appreciated that the resistance and capacitance of the insulator layer is such that its RC time constant should be large enough that the semiconductor layer is generally electrically isolated from the semiconductor substrate with respect to alternating-current (AC) operation, while it is generally electrically connected to the semiconductor substrate with respect to very low frequency or direct-current (DC) operation. In other words, during low frequency operation the resistive silicon acts as a low frequency filter and allows the low frequency charge buildup, i.e. holes or electrons, to pass through. On the other hand, during high frequency operation associated with the respective active devices the resistive silicon acts as a barrier to the high frequency currents passing through the insulating layer and isolates the active regions from the underlying substrate. An RC time constant greater than 1 usec is preferred.

Therefore, the parasitic capacitance can be kept low. For example, when the operating frequency, or the applicable electric signal frequency of the semiconductor device is 1 GHz, the electrical resistivity of the resistive silicon layer is preferably 10 ohm-cm or greater.

Now referring to FIG. 1, an exemplary embodiment of an SOI structure is illustrated. The SOI structure 10 is formed using a semiconductor substrate 12, a buried resistive silicon layer 14 formed on the semiconductor substrate 12 and a semiconductor layer 13 disposed on the resistive silicon layer 14. The resistive silicon layer 14 in one embodiment is undoped polysilicon. However, the resistive silicon layer 14 may be of doped silicon that has the characteristics described herein for resistivity and thermal conductivity.

The electrical properties of polysilicon depend strongly on the grain structure of the film. The grain boundaries provide a potential barrier to the moving charge carriers and affect the conductivity of the films. The resistivity of polysilicon decreases as the concentration of phosphorous increases up to about $1 \times 10^{21}$ atoms/$cm^3$. Above this value, the resistivity reaches a plateau, about $4 \times 10^{-4}$ ohm-cm, after a 1000° C. anneal. The maximum mobility for the highest phosphorous doped polysilicon is about 30 $cm^2$/V-s. Grain boundary and ionized impurity scattering are important factors limiting the mobility.

The thermal conductivity of polysilicon is a strong function of the grain structure of the film. For fine grain films, the thermal conductivity is about 0.30–0.35 W/cm-K, 20–25% of the single-crystal value. For thicker films with large grains, the thermal conductivity is between 50–85% of the single crystal value.

An exemplary resistive silicon layer 14 will be tailored to provide mobility for the carriers as well as a higher thermal conductivity than traditional $SiO_2$ to more efficiently dissipate heat. The exemplary resistive silicon layer 14 may have a thickness of between 1800 and 2200 Å. Whereas, an exemplary semiconductor layer 13 disposed on the resistive silicon layer 14 may have a thickness of between 800 and 1000 Å. Suitable semiconductor materials such as silicon (Si), silicon carbide (SiC), or silicon germanium (SiGe) may be used as the semiconductor layer 13 disposed on the resistive silicon layer 14. Within the semiconductor layer 13 disposed on the resistive silicon layer 14, electrical devices may be formed.

Figure 2:
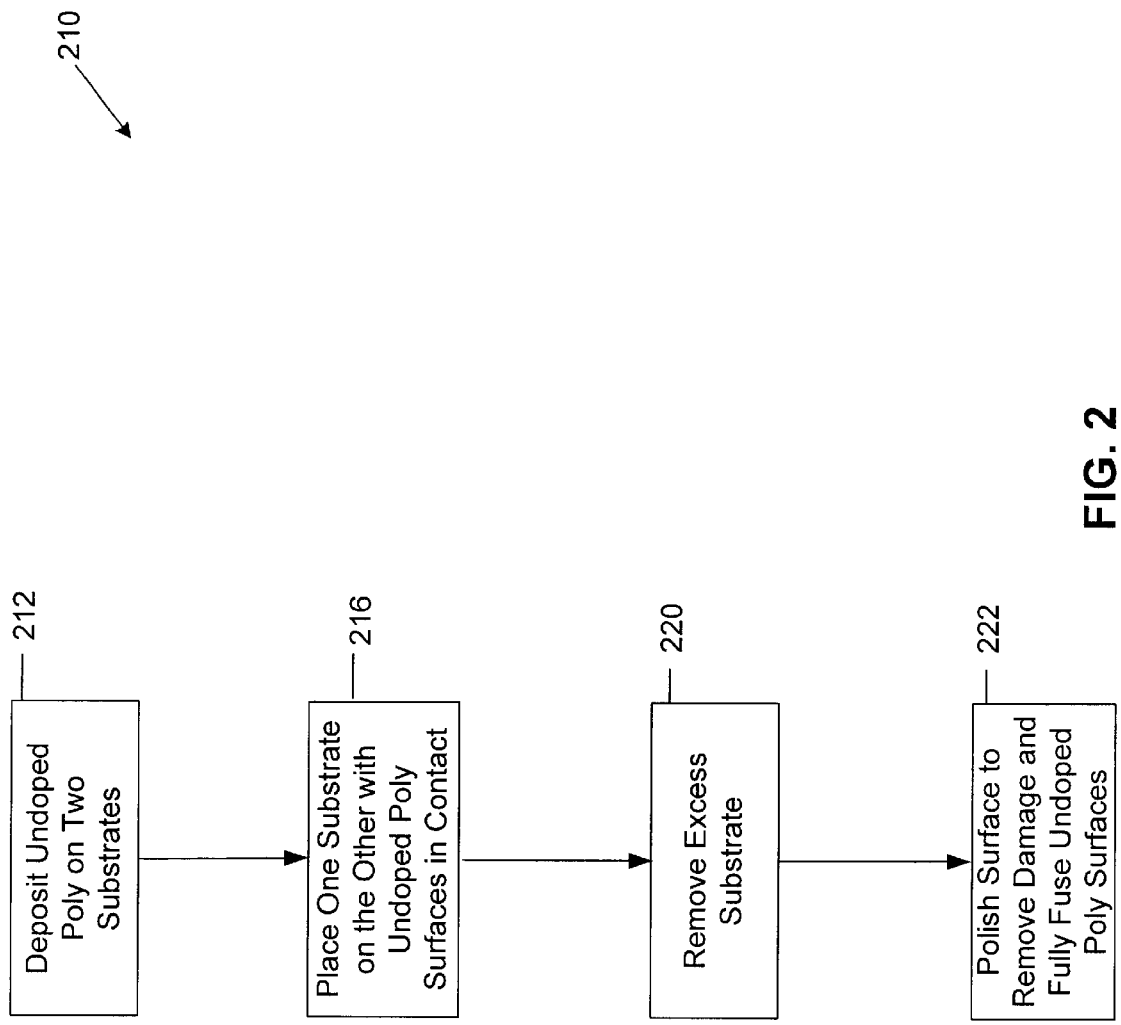
FIG. 2 is a flow diagram of a method of manufacturing the SOI structure according to the present invention.
Figure 3C:
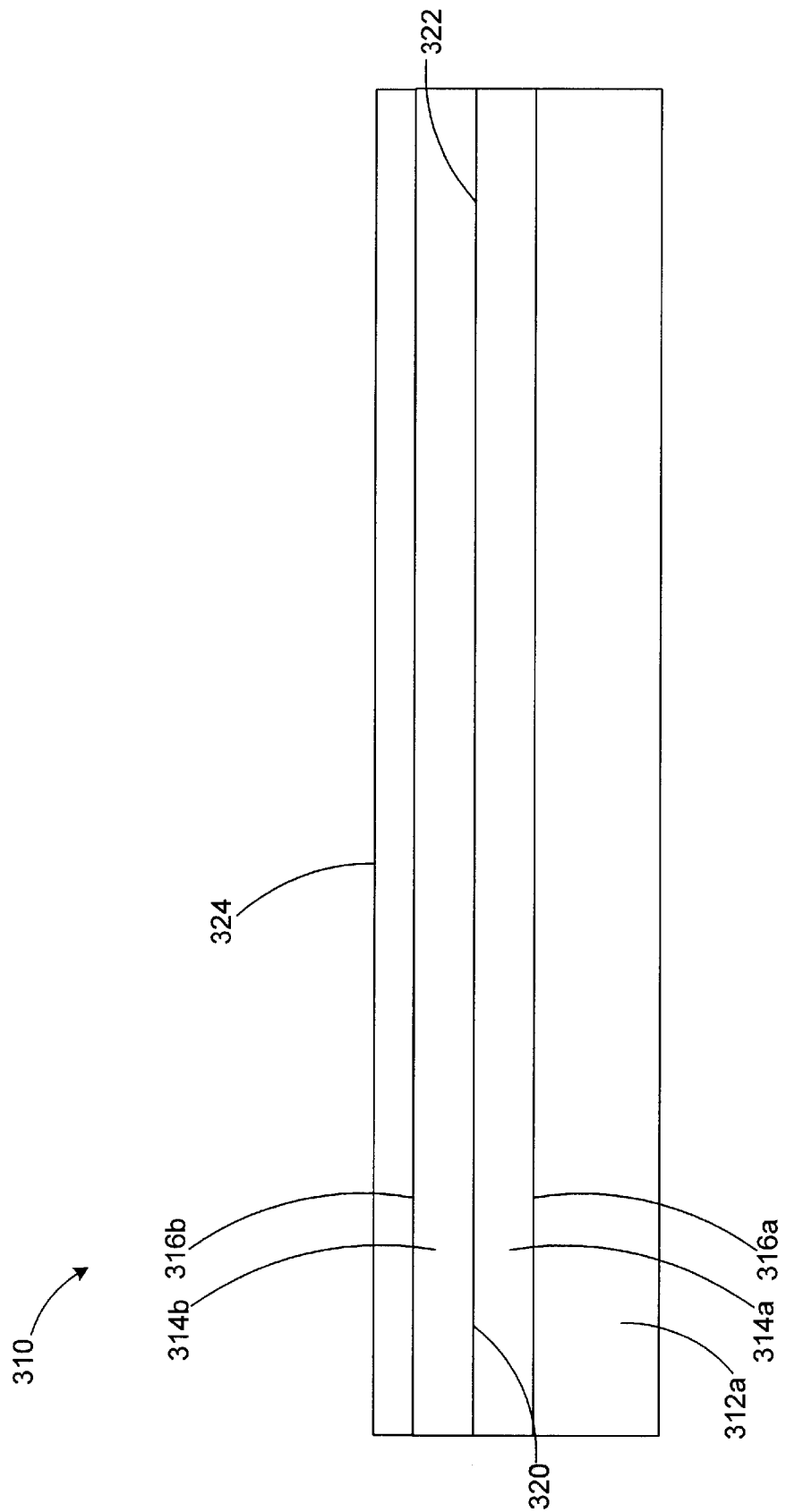

The steps of a method 210 for fabricating an SOI structure 310 (which may be similar to the semiconductor device 10 described above) are outlined in the flow chart shown in FIG. 2. FIGS. 3A–3C illustrate various steps of the method 210. It will be appreciated that the method 210 and the semiconductor device 310 described below are merely exemplary, and that suitable embodiments of the many variations in materials, thicknesses, and/or steps may alternatively be used in the method 210 and/or the SOI structure 310. Examples of other well-known techniques include zone melting recrystallization (ZMR), Bonded and Etchback (BESOI or the Smart-Cut.

In step 212 of the method 210, semiconductor substrates 312a, 312b have resistive silicon layers 314a, 314b formed on surfaces 316a, 316b, respectively, as an intermediate stage of manufacture for the SOI structure 310. As shown in FIG. 3A, the semiconductor substrate 312b with the resistive silicon layer 314b has been flipped over and placed above the semiconductor substrate 312a with the resistive silicon layer 314a. As shown by the dashed line in FIG. 3A, semiconductor substrate 312b has a zone of weakness 318 formed below the surface 316b. Each exemplary resistive silicon layer may have a thickness of between 900 angstroms (Å) and 1100 angstroms (Å). Whereas, each exemplary semiconductor substrate 312a, 312b may have a thickness of between 800 angstroms (Å) and 1000 angstroms (Å). Suitable semiconductor materials such as silicon(Si), silicon carbide (SiC), or silicon germanium(SiGe) may be used as the semiconductor material in semiconductor substrates 312a, 312b.

It will be appreciated that other methods may be used to form the intermediate substrates shown in FIG. 3A. It will further be appreciated that any processes, which will allow the semiconductor substrate to be broken along a plane leaving a thin layer of silicon on the SOI structure, may form the zone of weakness 318. It will also be appreciated that the zone of weakness may be formed through the surface 316b and a thin portion of the semiconductor substrate 312b before the resistive silicon layer is disposed thereon. It will also be understood that the zone of weakness alternatively may be formed through a thick portion of the semiconductor substrate 312b opposite the resistive silicon layer after the resistive silicon layer has been disposed thereon. Further, it will be understood that a zone of weakness may be formed through the resistive silicon layer and the thin portion of the semiconductor substrate 312b to form the intermediate device shown in FIG. 3A.

In step 216 of the method 210, a surface 320 of the resistive silicon layer 314b is placed in contact with a surface 322 of the resistive silicon layer 314a. Thus, surfaces 320 and 322 adhere to each other due to their adhesive characteristics. It will be appreciated that adhesive characteristics of such materials are well-known in the art. For example, it is known that when two ultra-clean and ultra-smooth silicon surfaces are placed in contact as in the case of surfaces 320 and 322, they will adhere to each other well enough for further processing to be done. The resulting structure is illustrated in FIG. 3B.

In step 220, the semiconductor substrate 312b is broken along the zone of weakness 318. It will be appreciated that processes, which include heat or mechanical pressure, for example, may break the zone of weakness. The resulting structure is illustrated in FIG. 3C.

In step 222 of the method 210, a polishing process is performed on the exposed damaged surface 324. The polishing process removes residual weak zone damage. The polishing process repairs the upper surface 324 of the SOI substrate 310 for future processing of electrical devices. The resulting structure is illustrated in FIG. 3C.

Further, in step 222, the SOI substrate 310 may be heated until the resistive silicon layers 314a and 314b are fully fused. The final structure is illustrated in FIG. 1.

It will be appreciated that many alternative sequences or steps may be used to accomplish the SOI structure 310. For example, the heating and fusing process in step 222 may be done following step 216.

Alternatively, semiconductor substrate 312a may have a thick, undoped polysilicon film deposited by Chemical Vapor Deposition (CVD) using dichlorosilane ($SiH_2Cl_2$) or the like to cover the substrate 314a. To flatten or planarize the surface of the undoped polysilicon film, the film is polished using a slurry until the desired thickness is reached. The slurry is, for example, made of an alkaline solution such as a potassium hydroxide (KOH) solution containing silica particles of 20 to 30 nm in diameter. A thin silicon layer 13 is formed upon the undoped polysilicon layer 314a by a deposition or growth process.

The undoped polysilicon layer typically has a large resistivity of 1000 ohm-cm or more. Therefore, the undoped polysilicon layer can be regarded as or equivalent to a dielectric concerning the parasitic capacitances between the substrate 312 and the interconnecting conductors for the operating frequency in the order of MHz or GHz. This means that the parasitic capacitances are kept low. Silicon has a dielectric constant of 11.0 and $SiO_2$ has a dielectric constant of 3.9.

Figure 4:
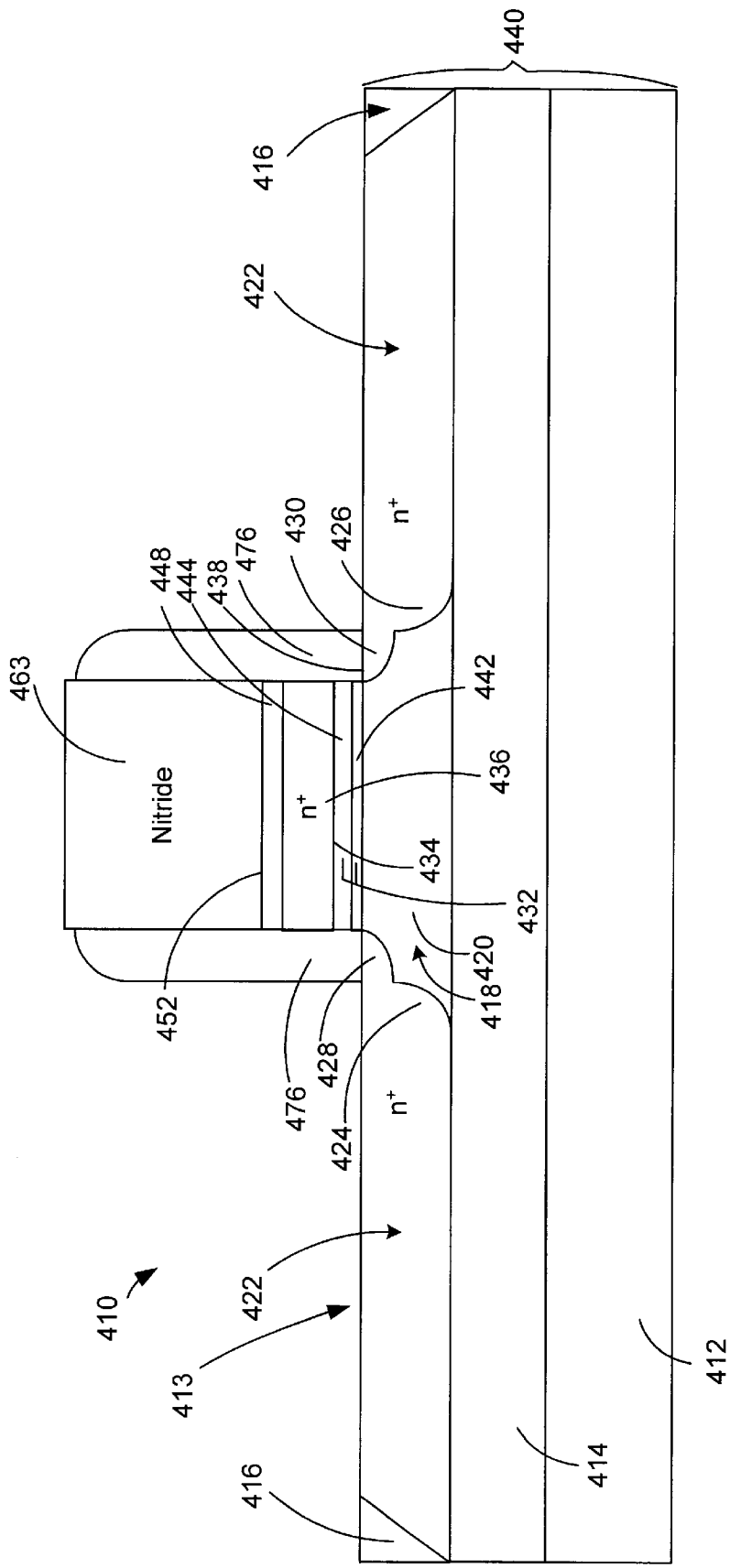
FIG. 4 is a cross-section of an SOI structure according to the present invention having a device formed thereon.

A device 410 on a semiconductor-on-insulator (SOI) structure 440 of the present invention is shown in FIG. 4 and described below, although other devices may be formed as well without departing from the invention herein described. Additionally, a device 410 or other devices may be formed on other types of SOI structures such as germanium-on-insulator wherein the insulator material is a leaky thermally conductive material as described above. It will be appreciated that the exemplary semiconductor device 410 described below may include many variations in materials, thicknesses, and/or structures.

Referring now to FIG. 4, a SOI substrate 440 is shown with an electrical device 410 formed thereon. The device 410 includes a conventional polysilicon gate with a nitride layer 463. As shown in FIG. 4, the SOI substrate 440 includes a semiconductor substrate 412, a resistive polysilicon layer 414 formed on the semiconductor substrate 412 and a semiconductor layer 413 disposed on the resistive silicon layer 414. Within the semiconductor layer 413 disposed on the resistive silicon layer 414, shallow trench isolation (STI) regions 416 along with the resistive silicon layer 414 define the placement of a semiconductor active region 418. The STI regions 416 are insulator-filled to electrically isolate individual electrical devices such as the device 410. Other isolation techniques that are known in the art may be used to isolate the device 410.

In an exemplary embodiment, as illustrated in FIG. 4, the active region 418 has a channel 420, and source and drain regions 422. The source and drain 422 are shown with respective deep implant regions 424 and 426, as well as respective extension regions 428 and 430. The active region 418 may be doped with p-type dopants for n-type channel devices and/or n-type dopants for p-type channel devices. An exemplary range of concentration of these dopants is between $1 \times 10^{18}$ atoms/$cm^3$ and $5 \times 10^{18}$ atoms/$cm^3$ for the p-type channel 420 and between $1 \times 10^{20}$ and $5 \times 10^{20}$ atoms/$cm^3$ for the N+ regions 422.

A gate dielectric 432 is interposed between the lower surface 434 of a gate electrode 436 and an upper surface 438 of the SOI semiconductor substrate 440. The gate dielectric 432 illustrated in FIG. 4 is a multi-layer dielectric, however the gate dielectric could be a single layer dielectric. The gate dielectric 432 may be made of suitable gate dielectric materials, such as silicon dioxide ($SiO_2$), silicon nitride ($Si_3N_4$), aluminum oxide ($Al_2O_3$), hafnium oxide ($HfO_2$), silicon oxynitride (SiON), or the like. In this embodiment, dielectric layer 442 is made of $SiO_2$ and dielectric layer 444 is made of $Si_3N_4$. The gate electrode 436 may be made of typical, well-known conductive materials, for example polysilicon.

On top of the gate electrode 436 is an oxide layer 448. The oxide layer 448 may be made of silicon dioxide ($SiO_2$) or any of a variety of suitable materials, which could be used to protect portions of the gate electrode 436 from an etchant. Spacers 476 extend upward from the upper surface 438 of the SOI substrate 440 on either side of the gate electrode 436. Exemplary spacers 476 may have a height of between 3000 and 4000 Å. The spacers 476 thereby define a nitride layer 463 interposed between the spacers 476.

The nitride layer 463 may be made of typical, well-known nitrides, for example silicon nitride ($Si_3N_4$), aluminum oxide ($Al_2O_3$), hafnium oxide ($HfO_2$), silicon oxynitride (SiON), or the like.

It will be appreciated that known methods may be used to form the device 410 shown in FIG. 4. It will further be appreciated that the insulator-filled isolation trenches 416 may be formed in an intermediate step of a method, rather than being formed prior to or after the forming of the device 410.

The source and the drain regions 422 regions may be formed by a combination of implants, such as main perpendicular implants and extension perpendicular implants. The extension perpendicular implant is a relatively low energy, low concentration implant which is capable of producing the source and drain extensions 428 and 430. The total concentration of the extension implants may be, for example, between $1\times10^{19}$ atoms/cm$^3$ and $1\times10^{20}$ atoms/cm$^3$. The extension perpendicular implants may be of the same material as the main perpendicular implant, or may alternatively include different materials. However, it will be appreciated that the extension implants may be different from one another, if so desired. Next, the main source and drain regions may be formed by a main perpendicular implant, which will not affect the extension implant due to the formation of spacers 476 which act as masks.

The main perpendicular implant is a relatively high energy, high concentration implant which is capable of producing the source and drain deep implant regions 424 and 426. An exemplary range of implant dose for the perpendicular implant is between $1\times10^{14}$ and $2\times10^{15}$ atoms/cm$^2$.

After implantation, the SOI structure 440 is subjected to rapid thermal annealing (RTA). Exemplary RTA may be performed for between five and fifteen seconds at a temperature of 1,020–1,050° C.

The present SOI structure is significantly more efficient at moving carriers and consumes significantly less wafer area than the side-contact solutions heretofore proposed to reduce thermal effects. As will be better appreciated in view of the following description, such SOI structures may have devices such as MOSFETs formed thereon. Such MOSFETs will be significantly less affected by the floating body effect (FBE) and self-heating due to the leaky and thermal conductive characteristics, respectively of the resistive silicon layer. The carriers, which accumulate near the source/body junctions of the MOSFET, will not accumulate sufficiently to forward bias the body with respect to the source. Thus, the lowering of the threshold voltage through the body-bias effect will be reduced. Further, extra current will not start flowing, thus the "kink" in the I–V characteristics will be significantly reduced or eliminated. Further still, this maintains the achievable gain and dynamic swing in analog circuits, and eliminates the abnormality in the transfer characteristics in digital circuits. Additionally, FBEs related to higher device leakages and the undesirable transient effect would be reduced.

The increased thermal conductivity of the resistive silicon layer reduces device failure due to Joule heating. The thermal conductive characteristics of the present invention significantly reduce the incident of severe localized silicon heating reducing the possibility of junction melting and the formation of silicon melt filaments. Thus, electrical shorts among the gate, source, drain and body of the transistors that may have resulted in device failure are significantly reduced. The thermal protection provided by the SOI structure of the present invention allows devices to consume less silicon area and operate at faster speeds.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor-on-insulator (SOI) structure having;
    a semiconductor substrate;
    a polysilicon layer disposed directly on the semiconductor substrate;
    a semiconductor layer disposed directly on the polysilicon layer; and
    active regions defined in the semiconductor layer by isolation trenches and the polysilicon layer.

2. The SOI structure according to claim 1, wherein the semiconductor substrate material is silicon (Si), silicon carbide (SiC), silicon germanium (SiGe) or any other semiconductive material.

3. The SOI structure according to claim 1, wherein the polysilicon layer is undoped.

4. The SOI structure according to claim 1, wherein the polysilicon layer is doped.

5. The SOI structure according to claim 1, wherein the polysilicon layer preferably has a resistivity value 10 ohm-cm or greater.

6. The SOI structure according to claim 1, wherein the polysilicon layer has a thermally conductivity value between about 85 W/mK to about 145 W.mK.

7. A method of fabricating a semiconductor-on-insulator (SOI) structure, the method comprising the steps of:
    depositing a polysilicon layer directly on a first semiconductor substrate;
    depositing a polysilicon layer directly on a second semiconductor substrate;
    creating a zone of weakness under a surface of one of the semiconductor substrates;
    placing one of the semiconductor substrates on top of the other semiconductor substrate such that the polysilicon layer on the first semiconductor substrate is in contact with the polysilicon layer on the second semiconductor substrate;
    breaking the zone of weakness on the one semiconductor substrate; and
    repairing a surface resulting from the breaking of the zone weakness of the one semiconductor substrate.

8. The SOI structure according to claim 7, wherein the polysilicon layer is undoped.

9. The SOI structure according to claim 7, wherein the polysilicon layer is doped.

10. The method according to claim 9, includes the additional step of;
    doping the polysilicon layers disposed on the first semiconductor substrate and the second semiconductor substrate.

11. The method according to claim 7, wherein the step of repairing a surface resulting from the breaking of the zone of weakness includes;

polishing the surface in order to remove residual weak zone damage.

12. The method according to claim 7, includes the additional step of;
   fusing the polysilicon layer of the first semiconductor substrate with the polysilicon layer of the second semiconductor substrate.

13. The method according to claim 12, wherein the step of fusing includes;
   heating the SOI structure until the polysilicon layer the first semiconductor substrate and the polysilicon layer of the second semiconductor substrate are fully fused.

14. A semiconductor-on-insulator (SOI) structure having;
   a semiconductor substrate;
   a polysilicon layer disposed directly on the semiconductor substrate; and
   a semiconductor layer disposed directly on the polysilicon layer.

15. The SOI structure according to claim 14, wherein the semiconductor substrate material is silicon (Si), silicon carbide (SiC), silicon germanium (SiGe) or any other semiconductive material.

16. The SOI structure according to claim 14, wherein the polysilicon layer is undoped.

17. The SOI structure according to claim 14, wherein the polysilicon layer is doped.

18. The SOI structure according to claim 14, wherein the polysilicon layer preferably has a resistivity value 10 ohm-cm or greater.

19. The SOI structure according to claim 14, wherein the polysilicon layer has a thermally conductivity value between about 85 W/mK to about 145 W/mK.

20. A method of fabricating a semiconductor-on-insulator (SOI) structure, the method comprising the steps of:
   depositing a polysilicon layer directly on a semiconductor substrate; and
   depositing a semiconductive layer directly on the polysilicon layer.

* * * * *